（12） United States Patent
Sotoku et al.

(10) Patent No.: US 11,342,162 B2
(45) Date of Patent: May 24, 2022

(54) RESIST REMOVING METHOD AND RESIST REMOVING APPARATUS

(71) Applicant: SCREEN Holdings Co., Ltd., Kyoto (JP)

(72) Inventors: Kota Sotoku, Kyoto (JP); Masaki Inaba, Kyoto (JP)

(73) Assignee: SCREEN Holdings Co., Ltd.

( * ) Notice: Subject to any disclaimer, the term of this patent is extended or adjusted under 35 U.S.C. 154(b) by 54 days.

(21) Appl. No.: 16/646,753

(22) PCT Filed: Jun. 15, 2018

(86) PCT No.: PCT/JP2018/022981
§ 371 (c)(1),
(2) Date: Mar. 12, 2020

(87) PCT Pub. No.: WO2019/053981
PCT Pub. Date: Mar. 21, 2019

(65) Prior Publication Data
US 2020/0272057 A1    Aug. 27, 2020

(30) Foreign Application Priority Data

Sep. 15, 2017    (JP) .............................. JP2017-177975

(51) Int. Cl.
*H01J 37/32*    (2006.01)
*G03F 7/42*    (2006.01)
(Continued)

(52) U.S. Cl.
CPC .......... *H01J 37/3244* (2013.01); *G03F 7/427* (2013.01); *G03F 7/70483* (2013.01);
(Continued)

(58) Field of Classification Search
CPC .. H01J 37/3244; G03F 7/427; G03F 7/70483; H01L 21/0273; H01L 21/31058; H01L 22/26
See application file for complete search history.

(56) References Cited

U.S. PATENT DOCUMENTS

| 2001/0000409 A1 | 4/2001 | Mitsuhashi ................ 250/492.2 |
| 2005/0011537 A1 | 1/2005 | Toshima et al. ................ 134/19 |

(Continued)

FOREIGN PATENT DOCUMENTS

| JP | S62-165935 A | 7/1987 |
| JP | H01-186619 A | 7/1989 |

(Continued)

OTHER PUBLICATIONS

International Preliminary Report on Patentability and Written Opinion dated Mar. 17, 2020 in corresponding International Patent Application No. PCT/JP2018/022981 with English translation.

(Continued)

*Primary Examiner* — Nicole M Ippolito
(74) *Attorney, Agent, or Firm* — Ostrolenk Faber LLP

(57) ABSTRACT

A hot plate of a resist removing apparatus is disposed in a processing space and heated to a predetermined temperature. A substrate has on an upper surface thereof, a pattern of a resist having a surface on which an altered layer is formed. A moving mechanism moves a plurality of lift pins relative to a hot plate. An upper surface of the substrate is supplied with ozone gas. A control part disposes the substrate at a first processing position with a clearance from the hot plate and removes the altered layer by using the ozone gas, and subsequently controls the moving mechanism to dispose the substrate at a second processing position with a clearance smaller than that between the first processing position and the hot plate and removes the resist by using the ozone gas.

(Continued)

It is thereby possible to efficiently remove the resist from the substrate while preventing popping.

13 Claims, 6 Drawing Sheets

(51) Int. Cl.
    *H01L 21/02*     (2006.01)
    *H01L 21/31*     (2006.01)
    *G03F 7/20*     (2006.01)
    *H01L 21/027*     (2006.01)
    *H01L 21/3105*     (2006.01)
    *H01L 21/66*     (2006.01)

(52) U.S. Cl.
    CPC .... *H01L 21/0273* (2013.01); *H01L 21/31058* (2013.01); *H01L 22/26* (2013.01)

(56) References Cited

U.S. PATENT DOCUMENTS

| | | | | |
|---|---|---|---|---|
| 2008/0305632 A1* | 12/2008 | Nishimura | .......... | H01L 21/6719 438/680 |
| 2012/0009796 A1 | 1/2012 | Cui et al. | ...................... | 438/711 |
| 2012/0138097 A1 | 6/2012 | Okorn-Schmidt et al. | ..... | 134/19 |

FOREIGN PATENT DOCUMENTS

| | | |
|---|---|---|
| JP | H11-67738 A | 3/1999 |
| JP | 2001-044178 A | 2/2001 |
| JP | 2002-100613 A | 4/2002 |
| JP | 2005-228790 A | 8/2005 |
| JP | 2006-286830 A | 10/2006 |
| JP | 2007-214513 | 8/2007 |
| JP | 2008-294169 A | 12/2008 |
| JP | 2009-021577 A | 1/2009 |
| JP | 2009-188220 A | 8/2009 |
| KR | 10-2007-0080662 A | 8/2007 |

OTHER PUBLICATIONS

International Search Report dated Aug. 28, 2018 in corresponding PCT International Application No. PCT/JP2018/022981.
Written Opinion dated Aug. 28, 2018 in corresponding PCT International Application No. PCT/JP2018/022981.
Korean Office Action dated May 1, 2021 in connection with Korean Application No. 10-20207007239.
Office Action dated Oct. 25, 2021 for the corresponding Japanese Application No. 2017-177975, machine translation attached.
Decision to Grant dated Nov. 3, 2021 for the corresponding Korean Patent Application No. 10-2020-7007239, machine translation attached.

* cited by examiner

RESIST REMOVING METHOD AND RESIST REMOVING APPARATUS

CROSS-REFERENCE TO RELATED APPLICATIONS

The present application is a 35 U.S.C. §§ 371 national phase conversion of PCT International Application No. PCT/JP2018/022981, filed Jun. 15, 2018, which claims priority to Japanese Patent Application No. 2017-177975, filed Sep. 15, 2017, the contents of both of which are incorporated herein by reference. The PCT International Application was published in the Japanese language.

TECHNICAL FIELD

The present invention relates to a resist removing method and a resist removing apparatus.

BACKGROUND ART

In a process of manufacturing a semiconductor substrate (hereinafter, referred to simply as a "substrate"), conventionally, performed is an ion implantation in which ions are implanted into a material of a substrate surface, to thereby change the properties of the material. In the ion implantation, for preventing the ions from being implanted into some portions that do not require the ion implantation, a pattern of a photoresist (hereinafter, referred to simply as a "resist") which is a photosensitive material is formed as a mask on the substrate surface. After the ion implantation, the pattern of the resist is removed in a resist removal process using a resist stripper.

In recent years, the dose amount of ions in the ion implantation has been increasing. In a case where a high dose amount of ions (for example, $10^{15}$ ions/cm² or more) is implanted, an altered layer (hardened layer) which requires time to be removed by the resist stripper is formed on a surface of the resist. Japanese Patent Application Laid-Open No. 2006-286830 proposes a method of quickly removing a resist, in which emission of ultraviolet rays is performed on a surface of a substrate, to thereby cut the bond of carbon and hydrogen in the resist and then a resist stripper is supplied onto the surface of the substrate.

Further, Japanese Patent Application Laid-Open No. 1-186619 (Document 2) discloses an apparatus for removing a resist on a substrate by using ozone under a heating condition. In the apparatus, a support mount is provided in a sealable reaction chamber and a substrate is placed on the support mount. Further, a $CO_2$ concentration meter is provided between the reaction chamber and an ozone decomposer on the downstream side. For removing the resist, the support mount is heated and ozone is carried into the reaction chamber. Further, the $CO_2$ concentration is measured by the $CO_2$ concentration meter, and when the $CO_2$ concentration becomes lower than a predetermined value, it is determined that the resist is completely decomposed and removed.

In a case where removal of a resist is performed by supplying ozone gas onto a substrate and heating the substrate which has been implanted with a high dose amount of ions, like in the method disclosed in Document 2, in the resist on which an altered layer is formed, a phenomenon sometimes occurs, in which the altered layer is ruptured due to an expansion of the inside thereof (a portion inner than the altered layer). This phenomenon is termed "popping", and due to the popping, a pattern on the substrate is collapsed and/or scattered fragments of the altered layer are deposited on a surface of the substrate and the inside of the apparatus. Though there is a possible case where the popping is prevented by lowering the heating temperature of the substrate, it takes a longer time to remove the resist.

SUMMARY OF INVENTION

The present invention is intended for a resist removing method for removing a resist from a substrate having, on a main surface thereof, a pattern of the resist having a surface on which an altered layer is formed, and it is an object of the present invention to efficiently remove the resist from the substrate while preventing popping.

The resist removing method according to the present invention, which is to remove a resist from a substrate having, on a main surface thereof, a pattern of the resist having a surface on which an altered layer is formed, includes a) removing the altered layer by supplying the main surface with ozone gas while disposing the substrate at a first processing position with a clearance from a hot plate heated to a predetermined temperature in a processing space shut off from the outside and b) removing the resist by supplying the main surface with the ozone gas while disposing the substrate at a second processing position with a clearance smaller than that between the first processing position and the hot plate, after the operation a).

According to the present invention, it is possible to efficiently remove the resist from the substrate while preventing popping.

In one preferred embodiment of the present invention, the resist removing method further includes c) detecting an endpoint of removal of the altered layer by measuring a concentration of a predetermined component in a gas exhausted from the processing space, concurrently with the operation a).

In this case, preferably, the endpoint of removal of the altered layer is detected on the basis of a rate of change in the concentration of the predetermined component in the operation c).

Further, the resist removing method may include detecting an endpoint of removal of the resist by measuring a concentration of the predetermined component in a gas exhausted from the processing space, concurrently with the operation b).

In another preferred embodiment of the present invention, the processing space is openable and closable, and when the processing space is opened, the substrate is passed from a holding part for holding the substrate to an external transfer mechanism in a state where the substrate is disposed at a position farther away from the hot plate than the first processing position.

In still another preferred embodiment of the present invention, a heating part is provided around a supply port for the ozone gas in a processing space forming part for forming the processing space.

In one aspect of the present invention, the predetermined temperature of the hot plate is not lower than a temperature at which a rupture of the altered layer occurs due to an expansion of the inside thereof in the resist on which the altered layer is formed.

The present invention is also intended for a resist removing apparatus. The resist removing apparatus according to the present invention includes a processing space forming part for forming a processing space which is shut off from the outside, a hot plate which is disposed in the processing space and heated to a predetermined temperature, a holding part for holding a substrate in the processing space, the substrate having, on a main surface thereof, a pattern of a resist having a surface on which an altered layer is formed, a moving mechanism for moving the holding part relative to the hot plate, an ozone gas supply part for supplying the main surface with ozone gas, and a control part for disposing the substrate at a first processing position with a clearance from the hot plate and removing the altered layer by using the ozone gas and for subsequently controlling the moving mechanism to dispose the substrate at a second processing position with a clearance smaller than that between the first processing position and the hot plate and removing the resist by using the ozone gas.

These and other objects, features, aspects and advantages of the present invention will become more apparent from the following detailed description of the present invention when taken in conjunction with the accompanying drawings.

DESCRIPTION OF EMBODIMENTS

Figure 1:
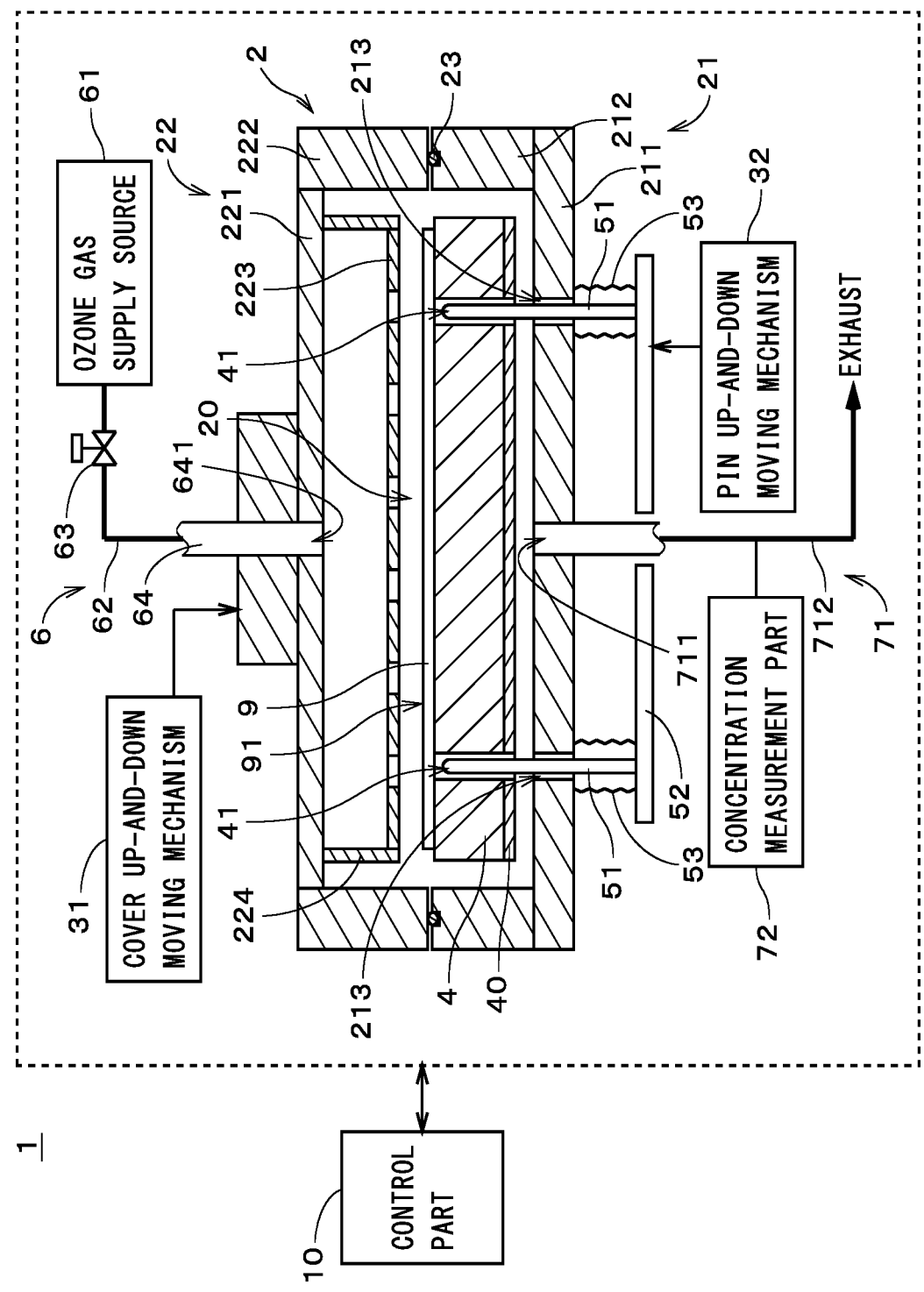
FIG. 1 is a view showing a configuration of a resist removing apparatus.

FIG. 1 is a view showing a configuration of a resist removing apparatus 1 in accordance with one preferred embodiment of the present invention. The resist removing apparatus 1 is an apparatus for removing a resist from a substrate having a pattern of the resist on a main surface thereof. The resist removing apparatus 1 includes a chamber 2, a cover up-and-down moving mechanism 31, a hot plate 4, a plurality of lift pins 51, a pin up-and-down moving mechanism 32, an ozone gas supply part 6, a gas exhaust part 71, a concentration measurement part 72, and a control part 10. The control part 10 performs a general control of the resist removing apparatus 1.

The chamber 2 includes a chamber body 21 and a chamber cover 22. The chamber body 21 includes a bottom plate 211 having a disk-like shape and a main-body side portion 212 having a cylindrical shape. The bottom plate 211 extends in a horizontal direction and the main-body side portion 212 extends upward from an outer edge portion of the bottom plate 211. The chamber cover 22 includes a top plate 221 having a disk-like shape and a cover side portion 222 having a cylindrical shape. The top plate 221 extends in the horizontal direction and the cover side portion 222 extends downward from an outer edge portion of the top plate 221. On a lower surface of the top plate 221, a shower plate 223 extending in the horizontal direction is fixed with a plate support part 224 interposed therebetween. The shower plate 223 is disposed between the top plate 221 and the hot plate 4. In the shower plate 223, formed are a large number of through holes. A lower end surface of the cover side portion 222 faces an upper end surface of the main-body side portion 212 along the entire circumference in an up-and-down direction. In the upper end surface of the main-body side portion 212, provided is an annular recessed portion, and an O-ring 23 is provided in the annular recessed portion. The chamber body 21 and the chamber cover 22 (including the shower plate 223) are formed of, for example, stainless steel.

Figure 2:
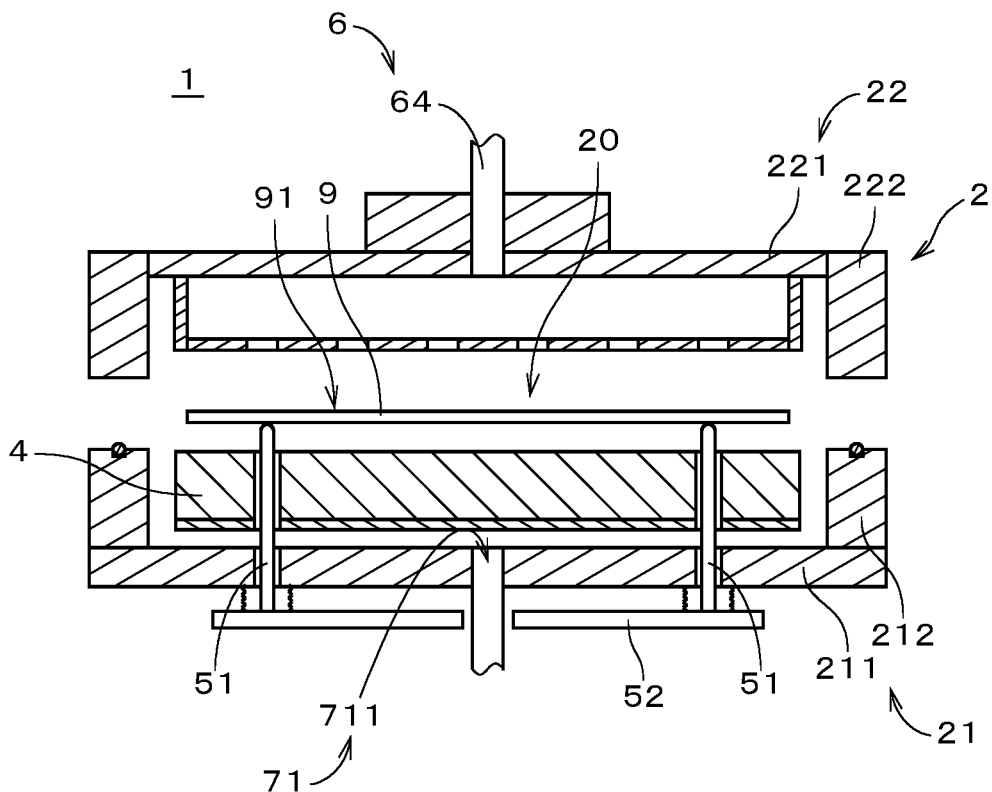
FIG. 2 is a view showing the resist removing apparatus in a state where a processing space is open.

The cover up-and-down moving mechanism 31 moves the chamber cover 22 up and down in the up-and-down direction, to thereby selectively dispose the chamber cover 22 at a lower position shown in FIG. 1 and an upper position shown in FIG. 2. In FIG. 2, the chamber cover 22 is away upward from the chamber body 21 and a large clearance is formed between the lower end surface of the cover side portion 222 and the upper end surface of the main-body side portion 212. In FIG. 1, the lower end surface of the cover side portion 222 and the upper end surface of the main-body side portion 212 are almost in contact with each other and an upper portion of the chamber body 21 is closed by the chamber cover 22. In the state of FIG. 1, the clearance between the lower end surface of the cover side portion 222 and the upper end surface of the main-body side portion 212 is sealed by the O-ring 23 and inside the chamber 2, formed is a processing space 20 shut off from the outside. The chamber 2 is a processing space forming part for forming the processing space 20. Further, the processing space 20 is openable and closable, and the cover up-and-down moving mechanism 31 is an opening and closing mechanism for opening/closing the processing space 20. The cover up-and-down moving mechanism 31 may use a motor or an actuator other than the motor. The opening and closing mechanism may be a mechanism for moving the chamber body 21.

The hot plate 4 is arranged in the processing space 20. The hot plate 4 has a thick disk-like shape and has a diameter larger than that of the disk-like substrate 9. In the hot plate 4, provided is a heater 40 including an electrically heated wire. The hot plate 4 is heated to a predetermined set temperature by a current supplied from an external power supply to the heater 40. The set temperature is, for example, 200° C. or higher and is not lower than an after-mentioned popping temperature at which popping occurs. An upper limit of the set temperature for the hot plate 4 shown in FIG. 1 is, for example, 300° C. The hot plate 4 is fixed to the chamber body 21 with a not-shown member interposed therebetween. The bottom plate 211, the top plate 221, and the hot plate 4 each of which has a disk-like shape have almost the same central axis. In the following description, a circumferential direction around this central axis is referred to simply as a "circumferential direction".

In the hot plate 4, a plurality of through holes 41 are arranged at a certain angular interval in the circumferential direction. In the bottom plate 211, through holes 213 are provided at positions which coincide with the through holes 41, respectively, in the up-and-down direction. Each of the plurality of lift pins 51 is inserted into a corresponding one of the pairs of the through holes 41 and the through holes 213. The number of lift pins 51 is typically three, and in this case, the lift pins 51 are arranged at an angular interval of 120 degrees in the circumferential direction. The number of lift pins 51 may be four or more. Respective lower ends of the plurality of lift pins 51 are fixed onto a pin support plate 52. Below the bottom plate 211, the circumference of each lift pin 51 is surrounded by a bellows 53. An upper end of the bellows 53 is fixed to a lower surface of the bottom plate 211 and a lower end of the bellows 53 is fixed to an upper surface of the pin support plate 52. The bellows 53 and the pin support plate 52 serve to prevent passage of gas or liquid between the inside and the outside of the chamber 2 through the through holes 213 in the bottom plate 211.

The pin up-and-down moving mechanism 32 includes a stepping motor and moves the pin support plate 52 up and down in the up-and-down direction. The plurality of lift pins 51 are thereby moved in the up-and-down direction. By the drive of the stepping motor, the pin support plate 52 and the plurality of lift pins 51 can be arranged at any position, for example, between the position shown in FIG. 1 and the position shown in FIG. 2 in the up-and-down direction. In FIG. 1, a tip (upper end) of each of the plurality of lift pins 51 is disposed inside the through hole 41 in the hot plate 4. In FIG. 2, the tip of each of the plurality of lift pins 51 is disposed upper than an upper surface of the hot plate 4. The respective tips of the plurality of lift pins 51 are each hemispherical and positioned at the same level (height) in the up-and-down direction. The pin up-and-down moving mechanism 32 may use another type of motor or an actuator other than the motor.

In the resist removing apparatus 1, when the tip of each of the plurality of lift pins 51 is disposed inside the through hole 41, the substrate 9 is placed on the upper surface of the hot plate 4 and held in a horizontal position. Further, when the tip of each of the plurality of lift pins 51 is disposed upper than the upper surface of the hot plate 4, the substrate 9 is supported by the plurality of lift pins 51 from below and held in the horizontal position. Thus, in the resist removing apparatus 1, a holding part for holding the substrate 9 in the processing space 20 is switched between the hot plate 4 and the plurality of lift pins 51. When the plurality of lift pins 51 serve as the holding part, the pin up-and-down moving mechanism 32 serves as a moving mechanism for moving the holding part relative to the hot plate 4. Further, a plurality of projections may be provided on the upper surface of the hot plate 4. In this case, when the respective tips of the plurality of lift pins 51 are positioned lower than respective upper surfaces of the plurality of projections, the substrate 9 is supported by the plurality of projections from below.

The ozone gas supply part 6 of FIG. 1 includes an ozone gas supply source 61, a gas supply pipe 62, a gas supply valve 63, and a gas nozzle 64. The gas nozzle 64 is provided at the center of the top plate 221 and has a gas supply port 641 which is opened toward the processing space 20 above the hot plate 4. The gas nozzle 64 is connected to the ozone gas supply source 61 through the gas supply pipe 62. On the gas supply pipe 62, provided is the gas supply valve 63. By opening the gas supply valve 63, ozone ($O_3$) gas is supplied from the gas nozzle 64 into the processing space 20.

As described earlier, between the top plate 221 and the hot plate 4, disposed is the shower plate 223. The ozone gas passes through a large number of through holes of the shower plate 223 and is supplied uniformly onto an upper main surface 91 (hereinafter, referred to simply as an "upper surface 91") of the substrate 9. In the top plate 221, a plurality of gas nozzles 64 may be dispersedly provided. In this case, the shower plate 223 may be omitted. In the present preferred embodiment, the ozone gas is ozone diluted with a predetermined gas. Another type of oxidizing gas or the like may be mixed into the ozone gas.

The gas exhaust part 71 includes a gas exhaust port 711 and a gas exhaust pipe 712. The gas exhaust port 711 is provided at the center of the bottom plate 211 and connected to one end of the gas exhaust pipe 712. The other end of the gas exhaust pipe 712 is connected to an ozone decomposition part (not shown) such as a filter or the like. The gas inside the processing space 20 is exhausted outside through the gas exhaust port 711 and the gas exhaust pipe 712. In the resist removing apparatus 1, a plurality of gas exhaust ports 711 may be provided, and the gas exhaust port(s) 711 may be provided in the outer edge portion of the bottom plate 211, on the main-body side portion 212, or the like. To the gas exhaust pipe 712, a concentration measurement part 72 is connected. The concentration measurement part 72 measures a concentration of a predetermined component in the gas (hereinafter, referred to as an "exhaust gas") exhausted from the processing space 20. In the present preferred embodiment, the concentration measurement part 72 measures a concentration of ozone and a concentration of carbon dioxide ($CO_2$) in the exhaust gas.

Figure 3:
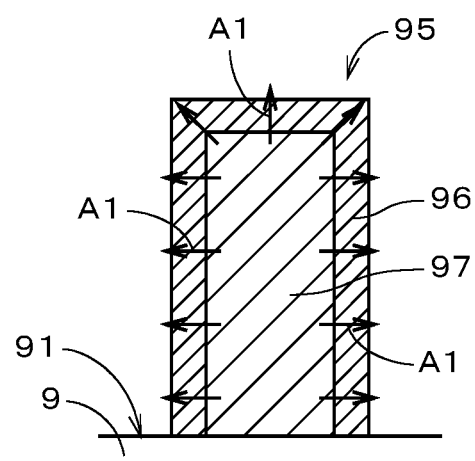
FIG. 3 is a cross section showing a resist.

Next, a resist formed on the substrate 9 will be described. FIG. 3 is a view abstractly showing a cross section of a resist 95 formed on the upper surface 91 of the substrate 9. The substrate 9 to be processed in the resist removing apparatus 1 has been implanted with a high dose amount of ions in a preprocessing, and an altered layer 96 is formed on a surface of the resist 95. In other words, in the resist 95, an unaltered portion 97 which is a portion inner than the altered layer 96 is entirely covered with the upper surface 91 of the substrate 9 and the altered layer 96. The altered layer 96 is sometimes referred to as a hardened layer.

Herein, when the substrate 9 having the resist 95 on which the altered layer 96 is formed is heated, popping in which the altered layer 96 is ruptured sometimes occurs due to an expansion of the inside thereof (for example, fullness of gas generated from the unaltered portion 97). The popping does not occur when the heating temperature of the substrate 9 is low. The temperature of the substrate 9 at which the popping occurs with a high frequency (for example, with a frequency of 50% or more) can be specified as a popping temperature by an experiment or the like. Hereinafter, description will be made on a process for efficiently removing the resist 95 on which the altered layer 96 is formed while preventing the popping.

Figure 4:
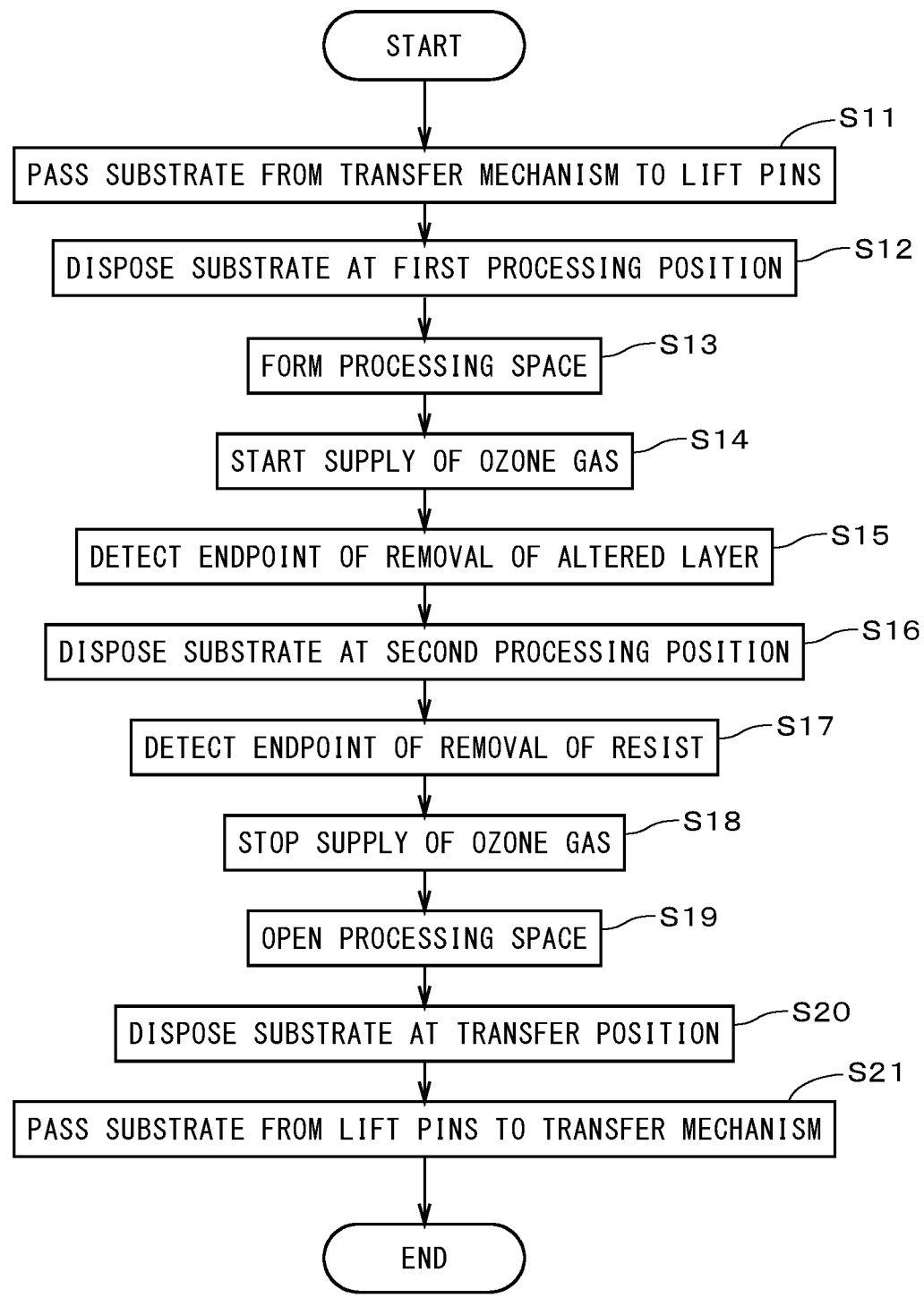
FIG. 4 is a flowchart showing an operation flow of a resist removal process.

FIG. 4 is a flowchart showing an operation flow of a resist removal process in the resist removing apparatus 1. In the resist removal process, first, the chamber cover 22 is disposed at the upper position shown in FIG. 2. Subsequently, by an external transfer mechanism, the substrate 9 is moved through the clearance between the lower end surface of the cover side portion 222 and the upper end surface of the main-body side portion 212 and disposed between the chamber cover 22 and the chamber body 21. Further, by the pin up-and-down moving mechanism 32, the plurality of lift pins 51 are moved upward to the position shown in FIG. 2. Then, the transfer mechanism slightly moves the substrate 9 downward, to thereby pass the substrate 9 from a support part of the transfer mechanism to the plurality of lift pins 51, and the substrate 9 is supported from below by the plurality of lift pins 51 (Step S11). Hereinafter, the position of the substrate 9 shown in FIG. 2 will be referred to as a "transfer position". Further, the substrate 9 may be passed from the support part to the plurality of lift pins 51 when the respective tips of the plurality of lift pins 51 move upward to be upper than the support part.

When the support part of the transfer mechanism moves outside the chamber body 21 and the chamber cover 22, the plurality of lift pins 51 move down, to thereby move the substrate 9 down from the transfer position to a position (hereinafter, referred to as a "first processing position") shown in FIG. 5 (Step S12). At the first processing position, there is a clearance having a predetermined width (for example, several mm) between a lower surface of the substrate 9 and the upper surface of the hot plate 4. Further, the chamber cover 22 is moved down by the cover up-and-down moving mechanism 31 and disposed at the lower position shown in FIG. 5. The processing space 20 is thereby formed to be shut off from the outside (Step S13). In other words, the processing space 20 is closed.

Figure 5:
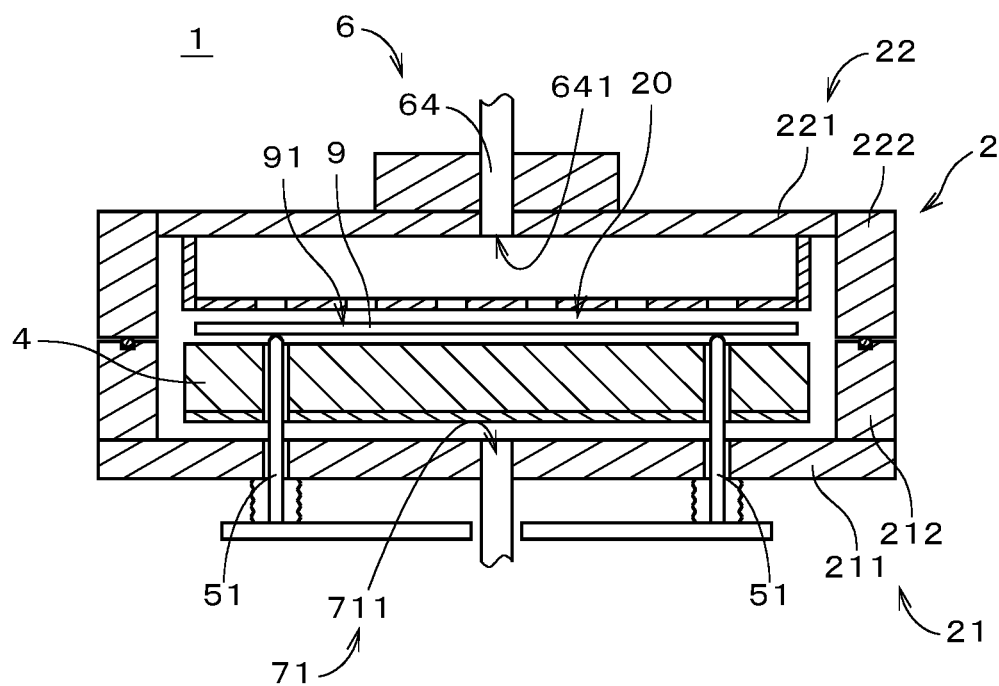
FIG. 5 is a view showing the resist removing apparatus in a state where a substrate is disposed at a first processing position.

The hot plate 4 has been heated to a constant set temperature, and in a state of FIG. 5 where the substrate 9 is in proximity to the hot plate 4 with the clearance interposed therebetween, the substrate 9 is heated to a temperature lower than the set temperature of the hot plate 4. In an actual case, the above-described set temperature and the above-described width of the clearance are determined by an experiment or the like so that the temperature of the substrate 9 may become lower than the already-described popping temperature.

Subsequently, the gas supply valve 63 is opened in the ozone gas supply part 6 and the ozone gas is ejected from the gas supply port 641 into the processing space 20 at a predetermined supply flow rate. In other words, the supply of the ozone gas onto the upper surface 91 of the substrate 9 is started (Step S14). The supply of the ozone gas is continuously performed concurrently with the heating of the substrate 9 by the hot plate 4. In an actual case, a not-shown exhaust valve which is provided on the gas exhaust pipe 712 shown in FIG. 1 is opened, and an exhaust operation of the gas from the processing space 20 is started. In the vicinity of the upper surface 91 of the substrate 9, the ozone gas is heated and decomposed and oxygen radical or the like is thereby generated. With the oxygen radical or the like, decomposition of the altered layer 96 which is an outermost surface of the resist 95 gradually proceeds. The concentration measurement part 72 always measures the ozone concentration and the carbon dioxide concentration in the exhaust gas and measured values thereof are outputted to the control part 10.

Figure 6:
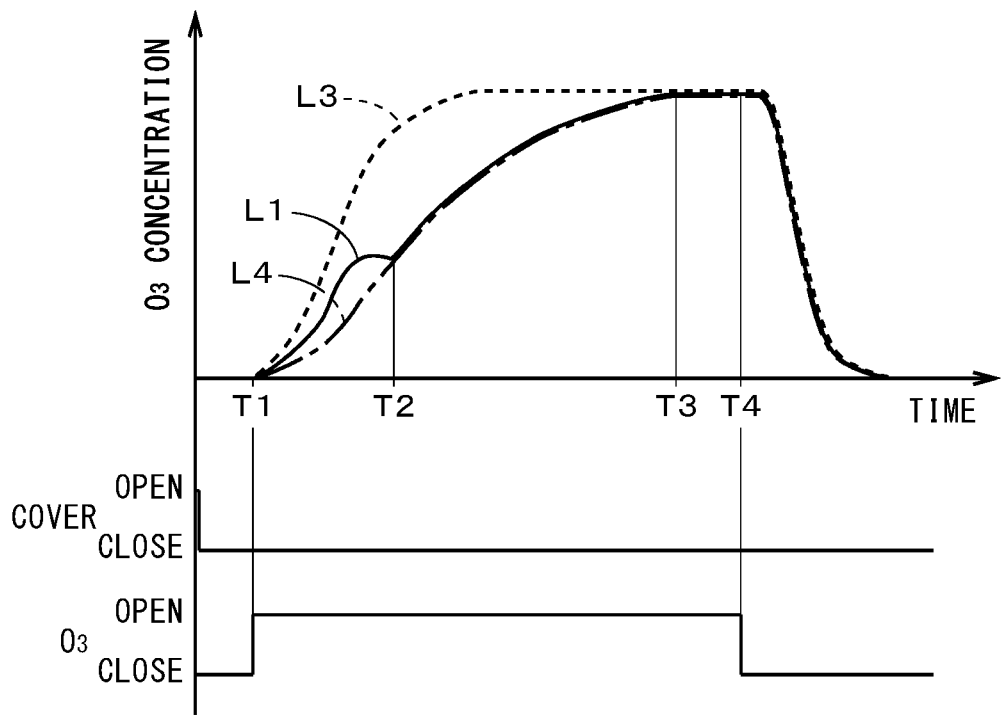
FIG. 6 is a graph showing a change in the ozone concentration in an exhaust gas.
Figure 7:
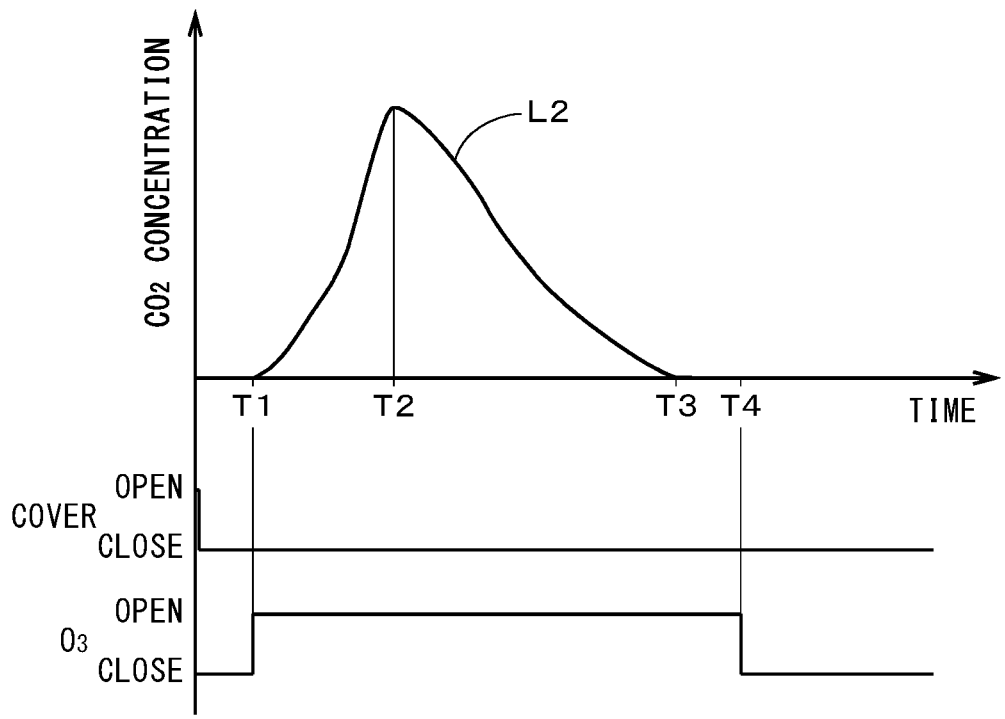
FIG. 7 is a graph showing a change in the carbon dioxide concentration in the exhaust gas.

FIG. 6 is a graph showing a change in the ozone concentration ($O_3$ concentration) in the exhaust gas, and FIG. 7 is a graph showing a change in the carbon dioxide concentration ($CO_2$ concentration) in the exhaust gas. In FIGS. 6 and 7, the changes in the ozone concentration and the carbon dioxide concentration in the exhaust gas are indicated by solid lines L1 and L2, respectively. Further, in FIG. 6, for comparison, a change in the ozone concentration which is obtained in a case where no substrate 9 is disposed in the processing space 20 is indicated by a broken line L3, and a change in the ozone concentration which is obtained in a case where the resist 95 on the substrate 9 has no altered layer 96 is indicated by a one-dot chain line L4. In respective lower stages of FIGS. 6 and 7, an open/close state of the chamber cover 22 and an open/close state of the ozone gas (the gas supply valve 63) are also shown. In FIGS. 6 and 7, at time T1, the supply of the ozone gas onto the upper surface 91 of the substrate 9 is started.

The air in the processing space 20 is replaced with the ozone gas little by little. As indicated by the solid line L1 in FIG. 6, the ozone concentration in the exhaust gas gradually increases from the start of the supply of the ozone gas. At that time, part of the ozone gas is used for the removal of the resist 95 on the substrate 9, exactly, the decomposition of the altered layer 96. Therefore, the ozone concentration at each time is lower as compared with the change in the ozone concentration (indicated by the broken line L3) in the case where no substrate 9 is disposed in the processing space 20. Further, as indicated by the solid line L2 in FIG. 7, with the decomposition of the altered layer 96, the carbon dioxide concentration also gradually increases. At initial time of the resist removal, most part of the removed resist 95 is the altered layer 96, and in the following description, such a period is referred to as an "altered layer removal period". Further, if the resist 95 on the substrate 9 has no altered layer 96 (in this case, the substrate 9 is disposed at the position shown in FIG. 1), since a larger amount of ozone gas is used for the decomposition of the resist 95, the ozone concentration (indicated by the one-dot chain line L4) at each time is lower than that indicated by the solid line L1.

When the decomposition of the altered layer 96 proceeds by supplying the ozone gas, part of the unaltered portion 97 is exposed in the resist 95. Since the unaltered portion 97 is easier to be decomposed than the altered layer 96, a larger amount of ozone gas is consumed than that in the altered layer removal period and a rate of change in the ozone concentration decreases. The control part 10 always obtains the rate of change in the ozone concentration during the resist removal. When the rate of change in the ozone concentration becomes not higher than a predetermined threshold value, it is determined that the removal of most part of the altered layer 96 is finished (Step S15). Thus, an endpoint of the removal of the altered layer 96 is detected on the basis of the rate of change in the ozone concentration. In FIGS. 6 and 7, at time T2, the removal of the altered layer 96 is almost completed.

When the endpoint of the removal of the altered layer 96 is detected, or when a predetermined time has elapsed from the detection of the endpoint, the plurality of lift pins 51 move down, to thereby move the substrate 9 down from the first processing position to the position (hereinafter, referred to as a "second processing position") shown in FIG. 1 (Step S16). At the second processing position, the substrate 9 is placed on the upper surface of the hot plate 4, and there is no clearance between the lower surface of the substrate 9 and the upper surface of the hot plate 4. In other words, the width of the clearance is zero. The temperature of the substrate 9 disposed at the second processing position becomes higher than that when the substrate 9 is disposed at the first processing position. In an actual case, the temperature of the substrate 9 rises to near the set temperature of the hot plate 4. Therefore, the decomposition of the ozone gas in the vicinity of the upper surface 91 of the substrate 9 is accelerated as compared with that in the altered layer removal period in which the substrate 9 is disposed at the first processing position. As a result, the decomposition of the remaining resist 95 (mainly the unaltered portion 97) is also accelerated. In the resist removing apparatus 1, the substrate 9 disposed at the second processing position may be away from the hot plate 4 only if the clearance between the substrate 9 disposed at the second processing position and the hot plate 4 is smaller than that between the substrate 9 disposed at the first processing position and the hot plate 4.

As the amount of resist 95 remaining on the substrate 9 decreases, the carbon dioxide concentration in the exhaust gas becomes lower. After that, the ozone concentration is saturated at a certain value and the carbon dioxide concentration becomes almost zero. When the carbon dioxide concentration becomes not higher than a predetermined threshold value, the control part 10 determines that the removal of the unaltered portion 97 is finished (Step S17). Thus, an endpoint of the removal of the resist 95 is detected by measuring the carbon dioxide concentration. In the resist removing apparatus 1, by disposing the substrate 9 at the second processing position after the removal of the altered layer 96, it is possible to complete the removal of the resist 95 in a shorter time as compared with a case where the processing continues while the substrate 9 is still disposed at the first processing position.

At time T3, when the endpoint of the removal of the resist 95 is detected, the gas supply valve 63 is closed, to thereby stop the supply of the ozone gas at time T4 when a predetermined time has elapsed from the time T3 (Step S18). The processing performed on the substrate 9 by using the ozone gas is thereby completed. The time period from the time T3 to the time T4 is a time period (overetching time) set for more reliably removing the resist 95 on the substrate 9. In an actual case, the not-shown exhaust valve which is provided on the gas exhaust pipe 712 is closed, and the exhaust operation of the gas from the processing space 20 is also stopped. Further, after the stop of the supply of the ozone gas, there may be a case where nitrogen gas or the like is supplied into the processing space 20 and the ozone gas is replaced with the nitrogen gas in the processing space 20.

Subsequently, the chamber cover 22 is moved up by the cover up-and-down moving mechanism 31 and disposed at the upper position shown in FIG. 2. The processing space 20 is thereby opened (Step S19). Further, the plurality of lift pins 51 move up, and the substrate 9 is thereby moved upward from the second processing position to the transfer position shown in FIG. 2 (Step S20). Furthermore, the support part of the transfer mechanism is disposed between the substrate 9 and the hot plate 4. Then, the support part moves upward, and the substrate 9 is thereby passed from the plurality of lift pins 51 to the support part (Step S21). In the resist removing apparatus 1, in a state where the substrate 9 is disposed at a position farther away from the hot plate 4 than the first processing position shown in FIG. 5, the substrate 9 is passed from the plurality of lift pins 51 which hold the substrate 9 to the transfer mechanism. After that, the substrate 9 is moved through the clearance between the lower end surface of the cover side portion 222 and the upper end surface of the main-body side portion 212 and unloaded to the outside of the resist removing apparatus 1. The resist removal process performed on the substrate 9 is thereby completed. When there is another substrate 9 to be processed next, the process of Steps S11 to S21 is repeated on the next substrate 9.

Herein, a resist removing apparatus in a comparative example will be described. In the resist removing apparatus of the comparative example, after loading of the substrate 9, the substrate 9 is disposed at the second processing position shown in FIG. 1 and the removal of the resist 95 (the altered layer 96 and the unaltered portion 97) is performed. As described earlier, in the resist 95 on which the altered layer 96 is formed, assuming that a temperature at which a rupture of the altered layer 96 occurs due to an expansion of the inside thereof is the popping temperature, the set temperature of the hot plate 4 is not lower than the popping temperature. Therefore, in the resist removing apparatus of the comparative example, sometimes popping occurs in the resist 95. In FIG. 3, the expansion of the unaltered portion 97 is indicated by arrows μl.

When the popping occurs, the pattern on the substrate 9 is collapsed and/or scattered fragments of the altered layer 96 are deposited on the upper surface 91 of the substrate 9 and the inside of the chamber 2. There is a possible case where the popping is prevented by making the set temperature of the hot plate 4 lower than the popping temperature. Since a removal rate of the resist 95 is affected by the temperature of the substrate 9, however, it takes a longer time to remove the resist 95. Further, there is a possibility that the substrate 9 may be excessively oxidized. Furthermore, though there is a possible case where the set temperature of the hot plate 4 is changed during the resist removal, it is difficult to sharply change the temperature of the hot plate 4.

In contrast to this, in the resist removing apparatus 1, the substrate 9 is disposed at the first processing position with a clearance from the hot plate 4 and the removal of the altered layer 96 is performed by using the ozone gas. Subsequently, by controlling the pin up-and-down moving mechanism 32, the substrate 9 is disposed at the second processing position with a clearance from the hot plate 4, which is smaller than that between the first processing position and the hot plate 4, and the removal of the resist 95 is performed by using the ozone gas. It is thereby possible to remove the resist 95 on the substrate 9 efficiently (in a short time) while preventing the popping, by using the hot plate 4 which is difficult to sharply change the temperature thereof. As a result, it is also possible to suppress excessive oxidation of the substrate 9. Further, since the second processing position is a position at which the substrate 9 comes into contact with the upper surface of the hot plate 4, it is possible to efficiently heat the substrate 9 to a high temperature.

By measuring a concentration of a predetermined component in the gas exhausted from the processing space 20 concurrently with the removal of the altered layer 96 by using the ozone gas, the endpoint of the removal of the altered layer 96 can be appropriately detected for each substrate 9. It is thereby possible to prevent the time period while the substrate 9 is heated at a relatively low temperature (while the substrate 9 is disposed at the first processing position) from becoming unnecessarily longer and reduce the time required to remove the resist 95 on the substrate 9. Further, it is possible to more reliably prevent the popping.

By measuring a concentration of a predetermined component in the gas exhausted from the processing space 20 concurrently with the removal of the resist 95 (mainly the unaltered portion 97) by using the ozone gas, the endpoint of the removal of the resist 95 can be also appropriately detected for each substrate 9. As a result, it is thereby possible to prevent the time period while the substrate 9 is heated from becoming unnecessarily longer and more reliably suppress excessive oxidation of the substrate 9. Further, it is possible to more reliably remove the resist 95.

In the pin up-and-down moving mechanism 32 having the stepping motor, the clearance between the substrate 9 and the hot plate 4 can be freely changed. As a result, it is possible to easily adjust the temperature of the substrate 9 in the altered layer removal period and more reliably prevent the popping.

Figure 8:
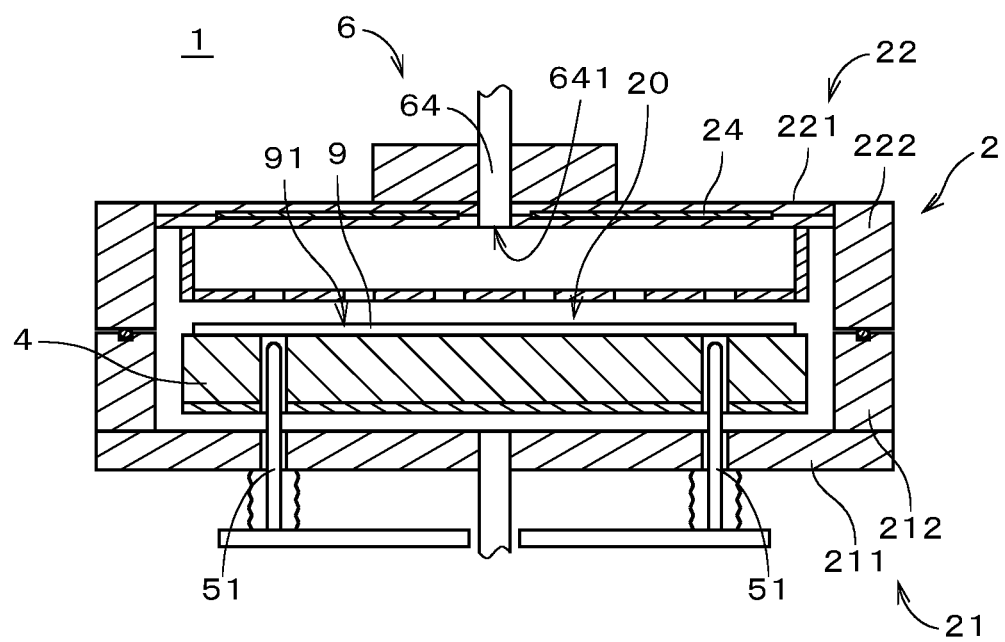
FIG. 8 is a view showing another exemplary resist removing apparatus.

FIG. 8 is a view showing another exemplary resist removing apparatus 1. In the resist removing apparatus 1 of FIG. 8, a heating part 24 is provided in the top plate 221 of the chamber cover 22. The constituent elements other than the above are identical to those in the resist removing apparatus 1 of FIG. 1, and the same constituent elements are represented by the same reference signs.

The heating part 24 provided in the chamber cover 22 surrounds the circumference of the gas supply port 641 which ejects the ozone gas. Therefore, when the ozone gas is supplied onto the upper surface 91 of the substrate 9, the top plate 221 is heated by the heating part 24 and the ozone gas to be ejected from the gas supply port 641 is also heated. The temperature of the ozone gas thereby becomes higher and the generation of the oxygen radical or the like is accelerated. As a result, it is possible to perform the removal of the altered layer 96 from the substrate 9 disposed at the first processing position and the removal of the unaltered portion 97 from the substrate 9 disposed at the second processing position in a short time without excessively increasing the temperature of the substrate 9. Thus, in the resist removing apparatus 1 of FIG. 8, it is possible to accelerate the removal of the resist 95. Further, since the temperature of the substrate 9 only slightly rises due to the heating of the top plate 221 by the heating part 24, it is possible to prevent the occurrence of the popping in the substrate 9 disposed at the first processing position during the removal of the altered layer 96.

In the resist removing apparatus 1 and the resist removing method described above, various modifications can be made.

The holding part for holding the substrate 9 at the first processing position may be other than the plurality of lift pins 51. For example, a holding part having a mechanism for gripping the outer edge portion of the substrate 9 may be adopted in the resist removing apparatus 1. In this case, depending on the design of the resist removing apparatus 1, the removal of the resist 95 may be performed with the main surface on which the resist 95 is formed facing downward or sideward. Further, the holding part has only to move relative to the hot plate 4, and a moving mechanism for moving the hot plate 4 in the up-and-down direction may be adopted.

The gas supply port 641 of the ozone gas supply part 6 may be provided in a portion other than the top plate 221 of the chamber cover 22 and may be provided in, for example, the cover side portion 222.

There may be a case where the concentration measurement part 72 measures only one of the ozone concentration and the carbon dioxide concentration and the endpoint of the removal of the altered layer 96 and the endpoint of the removal of the resist 95 are detected on the basis of a measured value of the one concentration. Further, a concentration of the ions implanted in the ion implantation performed by using the pattern of the resist 95 may be detected by the concentration measurement part 72.

If the concentration of the predetermined component in the gas exhausted from the processing space 20 can be practically measured, the concentration measurement part 72 may be provided on other than the gas exhaust pipe 712. For example, the concentration measurement part 72 may be provided in the vicinity of the gas exhaust port 711 in the bottom plate 211.

The control part 10 may detect the endpoint of the removal of the altered layer 96 by using any one of various methods on the basis of the measured value of the concentration measurement part 72. There may be a case, for example, where a reference profile indicating a typical change in the ozone concentration or the carbon dioxide concentration from the start of the removal of the altered layer 96 to the end thereof is prepared and the endpoint of the removal of the altered layer 96 is detected by fitting between a profile of an actually-obtained concentration change and the reference profile. Similarly, the control part 10 may detect the endpoint of the removal of the resist 95 (the unaltered portion 97) by using any one of various methods on the basis of the measured value of the concentration measurement part 72.

The configurations in the above-discussed preferred embodiment and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST

1 Resist removing apparatus
2 Chamber
4 Hot plate
6 Ozone gas supply part
9 Substrate
10 Control part
20 Processing space
24 Heating part
31 Cover up-and-down moving mechanism
32 Pin up-and-down moving mechanism
51 Lift pin
72 Concentration measurement part
91 Upper surface
95 Resist
96 Altered layer
641 Gas supply port
S11 to S21 Step

The invention claimed is:

1. A resist removing apparatus, comprising:
a processing space forming part for forming a processing space which is shut off from the outside;
a hot plate which is disposed in said processing space and heated to a predetermined temperature;
a holding part for holding a substrate in said processing space, said substrate having, on a main surface thereof, a pattern of a resist having a surface on which an altered layer is formed;
a moving mechanism for moving said holding part relative to said hot plate;
an ozone gas supply part for supplying said main surface with ozone gas; and
a control part for disposing said substrate at a first processing position with a gap from said hot plate and removing said altered layer by using said ozone gas and for subsequently controlling said moving mechanism to dispose said substrate at a second processing position with a gap smaller than that between said first processing position and said hot plate and removing said resist by using said ozone gas.

2. The resist removing apparatus according to claim 1, further comprising:
a concentration measurement part for measuring a concentration of a predetermined component in a gas exhausted from said processing space,
wherein said control part detects an endpoint of removal of said altered layer on the basis of a measured value of said concentration measurement part.

3. The resist removing apparatus according to claim 2, wherein
said control part detects an endpoint of removal of said altered layer on the basis of a rate of change in the concentration of said predetermined component.

4. The resist removing apparatus according to claim 2, wherein
said control part detects an endpoint of removal of said resist on the basis of a measured value of said concentration measurement part.

5. The resist removing apparatus according to claim 1, further comprising:
an opening and closing mechanism for opening/closing said processing space, wherein when said processing space is opened, said control part disposes said substrate at a position farther away from said hot plate than said first processing position and passes said substrate from said holding part to an external transfer mechanism.

6. The resist removing apparatus according to claim 1, wherein
a heating part is provided around a supply port for said ozone gas in said processing space forming part.

7. The resist removing apparatus according to claim 1, wherein
said predetermined temperature of said hot plate is not lower than a temperature at which a rupture of said altered layer occurs due to an expansion of the inside thereof in said resist on which said altered layer is formed.

8. A resist removing apparatus, comprising:
a processing space forming part for forming a processing space which is shut off from the outside;
a hot plate which is disposed in said processing space and heated to a predetermined temperature;
a holding part for holding a substrate in said processing space, said substrate having, on a main surface thereof, a pattern of a resist having a surface on which an altered layer is formed;
an ozone gas supply part for supplying said main surface with ozone gas;
a concentration measurement part for measuring a concentration of a predetermined component in a gas exhausted from said processing space, and
a control part for detecting an endpoint of removal of said altered layer on the basis of a measured value of said concentration measurement part.

9. The resist removing apparatus according to claim 8, wherein
said predetermined component is ozone gas, and
said control part detects an endpoint of removal of said altered layer on the basis of a rate of change in the concentration of ozone gas.

10. The resist removing apparatus according to claim 8, wherein
said concentration measurement part measures a concentration of carbon dioxide in said gas exhausted from said processing space, and
said control part detects an endpoint of removal of said resist on the basis of a measured value of concentration of carbon dioxide by said concentration measurement part.

11. The resist removing apparatus according to claim 8, further comprising:
a moving mechanism for moving said holding part relative to said hot plate; and
an opening and closing mechanism for opening/closing said processing space,
wherein when said processing space is opened, said control part disposes said substrate at a position farther away from said hot plate and passes said substrate from said holding part to an external transfer mechanism.

12. The resist removing apparatus according to claim 8, wherein
a heating part is provided around a supply port for said ozone gas in said processing space forming part.

13. The resist removing apparatus according to claim 8, wherein
said predetermined temperature of said hot plate is not lower than a temperature at which a rupture of said altered layer occurs due to an expansion of the inside thereof in said resist on which said altered layer is formed.

\* \* \* \* \*